(12) United States Patent
Sato et al.

(10) Patent No.: US 9,280,048 B2
(45) Date of Patent: Mar. 8, 2016

(54) IMPRINT APPARATUS AND METHOD OF MANUFACTURING ARTICLE

(71) Applicant: CANON KABUSHIKI KAISHA, Tokyo (JP)

(72) Inventors: Hiroshi Sato, Utsunomiya (JP); Hideki Ina, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 42 days.

(21) Appl. No.: 14/261,889

(22) Filed: Apr. 25, 2014

(65) Prior Publication Data

US 2014/0234467 A1   Aug. 21, 2014

Related U.S. Application Data

(62) Division of application No. 13/049,207, filed on Mar. 16, 2011, now Pat. No. 9,122,149.

(30) Foreign Application Priority Data

Mar. 24, 2010   (JP) .................................. 2010-068916

(51) Int. Cl.
   *B05D 3/12* (2006.01)
   *G03F 7/00* (2006.01)
   *B82Y 10/00* (2011.01)
   (Continued)

(52) U.S. Cl.
   CPC .............. *G03F 7/0002* (2013.01); *B29C 59/02* (2013.01); *B82Y 10/00* (2013.01); *B82Y 40/00* (2013.01)

(58) Field of Classification Search
   CPC  B29C 59/02; B29C 59/002; B29C 2059/023; G03F 7/0002
   USPC .......... 264/293, 494, 496; 425/385, 388, 437, 425/174.4
   See application file for complete search history.

(56) References Cited

U.S. PATENT DOCUMENTS

| 2008/0164638 A1 | 7/2008 | Zhang |
| 2009/0140458 A1 | 6/2009 | Xu et al. |
| 2010/0164146 A1 | 7/2010 | Furutono et al. |

FOREIGN PATENT DOCUMENTS

| EP | 2353828 A1 | 8/2011 |
| JP | 2003211504 A | 7/2003 |

(Continued)

OTHER PUBLICATIONS

Office Action issued in counterpart Japanese Patent Application No. 2010-068916 dated May, 30 2014.

(Continued)

*Primary Examiner* — Timothy Kennedy
(74) *Attorney, Agent, or Firm* — Rossi, Kimms & McDowell LLP (57) ABSTRACT

An imprint apparatus which cures a resin dispensed on a substrate while the resin and a pattern surface of a mold are in contact with each other, comprises a supply portion configured to supply a gas, used to accelerate filling of a concave portion of the pattern surface of the mold with the resin, to a space which the pattern surface of the mold faces, and a controller configured to control the supply portion to supply the gas to the space before the resin and the pattern surface of the mold are brought into contact with each other, wherein the supply portion is configured to supply the gas to the space via a porous portion formed in at least part of the mold.

2 Claims, 5 Drawing Sheets

(51) Int. Cl.
*B82Y 40/00* (2011.01)
*B29C 59/02* (2006.01)

(56) References Cited

FOREIGN PATENT DOCUMENTS

| JP | 2007-283513 | A | 11/2007 |
|---|---|---|---|
| JP | 4185941 | B2 | 11/2008 |
| JP | 2010-149482 | A | 7/2010 |
| KR | 100710851 | B1 | 4/2007 |
| TW | 201000392 | A | 1/2010 |
| WO | 2010005032 | A1 | 1/2010 |
| WO | 2012006521 | A1 | 1/2010 |
| WO | 2010047821 | A1 | 4/2010 |
| WO | 2010063504 | A2 | 6/2010 |

OTHER PUBLICATIONS

Siddharth Chauhan, "Feature Filling Modeling for Step and Flash Imprint Lithography", J. Vac. Sci. Technol. B 27(4), Jul./Aug. 2009. XP-002674937. (Cited in EPSR in corresp. appln. No. EP11158403. 3, dated May 11, 2012.) Cited in parent U.S. Appl. No. 13/049,207.

Y.S. Kim, "Fabrication of Three-Dimensional Microstructures by Soft Molding", Applied Physics Letters; vol. 79, No. 14, Oct. 1, 2001, XP012029064. (Cited in EPSR in corresp. appln. No. EP11158403.3, dated May 11, 2014.) Cited in parent U.S. Appl. No. 13/049,207.

European Search Report issued in corresponding patent application EP11158403.3, issued May 11, 2012. Cited in parent U.S. Appl. No. 13/049,207.

Taiwanese Office Action cited in Taiwanese counterpart application No. TW100109349, dated Aug. 19, 2013. Cited in parent U.S. Appl. No. 13/049,207.

Korean Office Action issued Jun. 20, 2013 for corresponding 10-2011-0025774. Cited in parent U.S. Appl. No. 13/049,207.

Masuda et al.; "Control of Nanohole Shapes of Anodic Porous Alumina and Its Applications"; Surface Chemistry vol. 25, No. 5, pp. 260-264, 2004. Cited in parent U.S. Appl. No. 13/049,207.

Sato; "Self-Organizing Formation of Semiconductor Porous Structure"; Hokkaido University. Oct. 29, 2007. Cited in parent U.S. Appl. No. 13/049,207.

Maekawa; "Research related to creation of porous structures using a sheet lamination method"; Tsukuba University Feb. 2009. Cited in parent U.S. Appl. No. 13/049,207.

IMPRINT APPARATUS AND METHOD OF MANUFACTURING ARTICLE

BACKGROUND OF THE INVENTION

1. Field of the Invention

The present invention relates to an imprint apparatus, and a method of manufacturing an article using the imprint apparatus.

2. Description of the Related Art

Imprint techniques are coming into practical use as one type of lithographic technique intended for mass production of magnetic storage media and semiconductor devices. An imprint technique of forming a pattern on the order of nanometers is known as a nanoimprint technique. Imprint techniques involve a mold (original) on which a pattern is formed that is pressed against a resin dispensed on a substrate such as a silicon wafer or a glass plate. The resin is cured in this state, thereby transferring the pattern onto the substrate.

The conventional imprint methods pose problems in that it takes a long time to fill concave portions of the pattern formed on the mold with the resin, and that a defect occurs if a curing process is executed before the concave portions of the pattern are completely filled with the resin. The conventional imprint methods also pose the problems that a large force is necessary to separate the mold from the resin or the substrate after the resin cures, and that this leads to a defect in the pattern transferred onto the substrate.

SUMMARY OF THE INVENTION

The present invention provides an advantageous technique to improve the throughput and/or yield of imprint processing while suppressing complication of the arrangement of an imprint apparatus.

One of the aspects of the present invention provides an imprint apparatus which cures a resin dispensed on a substrate while the resin and a pattern surface of a mold are in contact with each other, the apparatus comprising: a supply portion configured to supply a gas, used to accelerate filling of a concave portion of the pattern surface of the mold with the resin, to a space which the pattern surface of the mold faces; and a controller configured to control the supply portion to supply the gas to the space before the resin and the pattern surface of the mold are brought into contact with each other, wherein the supply portion is configured to supply the gas to the space via a porous portion formed in at least part of the mold.

Further features of the present invention will become apparent from the following description of exemplary embodiments with reference to the attached drawings.

DESCRIPTION OF THE EMBODIMENTS

Preferred embodiments of the present invention will be described in detail below with reference to the accompanying drawings.

<First Embodiment>

Figure 1A:
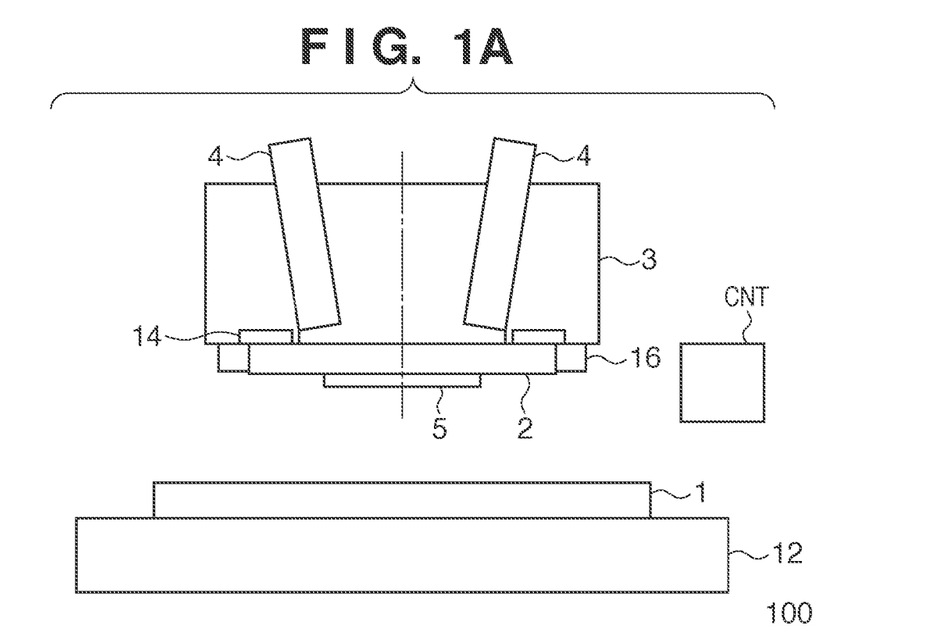
FIGS. 1A and 1B are views schematically showing the arrangement of an imprint apparatus according to an embodiment of the present invention.

An imprint apparatus 100 according to the first embodiment of the present invention will be described with reference to FIG. 1A. The imprint apparatus 100 supplies energy to a resin dispensed on a substrate 1 such as a wafer or a glass substrate while a pattern surface PS of a mold 2 is in contact with the resin, thereby curing the resin. Thus, a pattern formed on the pattern surface PS of the mold 2 is transferred onto the substrate 1 as the pattern of the resin. The energy used to cure the resin is typically light (for example, ultraviolet light) or heat. The imprint apparatus 100 can include, for example, a positioning mechanism 12 which positions the substrate 1, and an imprint head 3 having a chuck 14 which holds the mold 2. The imprint apparatus 100 can additionally include a controller CNT which controls an imprint operation, a driving mechanism (not shown) which brings the mold 2 into contact with the substrate 1 via the resin or separates the mold 2 from the substrate 1, a curing unit (not shown) which cures the resin by supplying energy to the resin, and a dispense mechanism which dispenses the resin onto the substrate 1. The driving mechanism can be configured to, for example, press the mold 2 against the substrate 1 via the resin by driving the imprint head 3. In another embodiment, the driving mechanism is built into the positioning mechanism 12, and drives the substrate 1 to form the state in which the mold 2 is pressed against the substrate 1 via the resin. The imprint apparatus 100 also includes a supply portion 16 which supplies a gas to the mold 2. A scope 4 can be placed on the imprint head 3. The scope 4 optically observes a mark formed on the mold 2 and that formed on the substrate 1, thereby detecting their relative position. The positioning mechanism 12 positions the substrate 1 based on the relative position detected by the scope 4.

Figure 2:
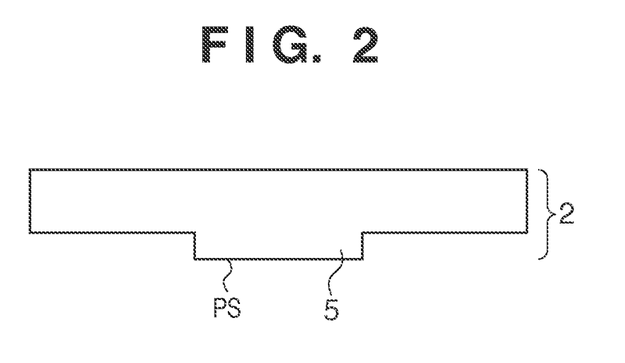
FIG. 2 is a view showing the schematic arrangement of a mold.

FIG. 2 shows the schematic arrangement of the mold 2. In an arrangement in which the resin is cured using light such as ultraviolet light, the mold 2 is made of a light-transmitting material such as quartz, and the resin can be irradiated with light via the mold 2 by epi-illumination. The mold 2 can have a shape with a convex pattern portion 5 having the pattern surface PS on which a pattern is formed. This is to prevent the mold 2 from coming into contact with a shot region adjacent to a target shot region on the substrate 1 upon pressing the mold 2 against the target shot region via the resin.

Figure 3:
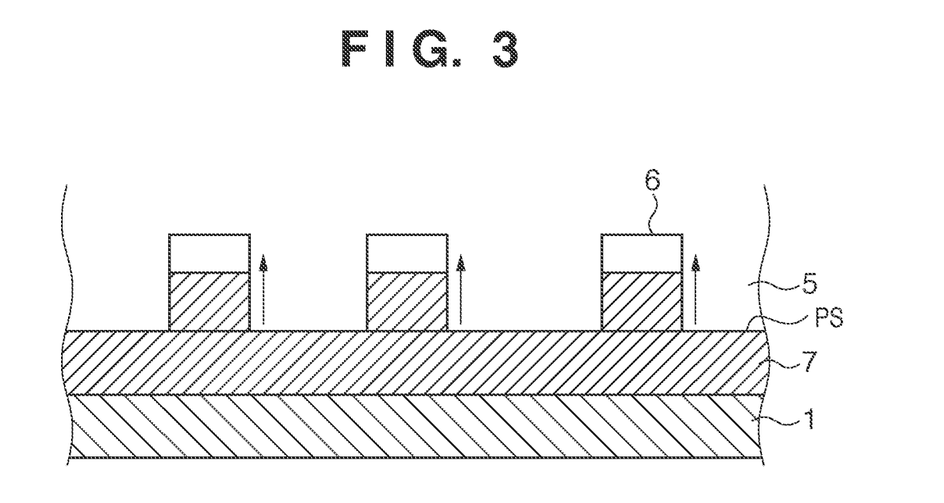
FIG. 3 is a view schematically showing filling of concave portions of a pattern formed in a pattern portion of the mold with a resin.

FIG. 3 schematically shows the state in which the pattern portion 5 of the mold 2 is pressed against the substrate 1 via a resin 7 or that in which the pattern surface PS of the mold 2 is in contact with the resin 7 dispensed on the substrate 1. The pattern formed on the pattern surface PS in the pattern portion 5 includes concave portions 6. In other words, the pattern includes the concave portions 6 and convex portions. When the pattern portion 5 of the mold 2 is pressed against the resin 7 dispensed on the substrate 1, the concave portions 6 of the pattern are filled with the resin 7 by capillarity. Note that before the pattern portion 5 comes into contact with the resin 7, a gas is present in the concave portions 6. In a general imprint technique, the gas present in the concave portions 6 dissolves in the resin, thereby completely filling the concave portions 6 with the resin. To do this, an arrangement which covers the imprint head 3 with a gas (for example, hydrogen or helium with a low molecular weight) which is soluble in the resin can be employed. However, when a cover is provided to surround the imprint head 3 in order to realize this arrangement, a mechanism which moves the cover to replace, for example, the mold 2 must also be provided, and this may complicate the arrangement of the imprint apparatus 100. Also, the mounting of the cover may limit the degree of freedom of mounting other devices.

Hence, in this embodiment, the mold 2 is provided with a porous portion such as a porous layer to supply a gas from the imprint apparatus 100 to the pattern portion 5 via the porous portion. The porous portion can be made of, for example, a transparent material such as a porous silica material. Porous silica can be formed by coating a member with a mixed solution, in which a silica material and a polymeric material such as polystyrene particles are dispersed, at a thickness of several to several hundred microns, and heating and removing the polymeric material. This method can obtain a porous structure in which, for example, cavities on the order of several nanometers to several tens of nanometers are arrayed regularly or irregularly. The imprint apparatus 100 includes the supply portion 16 which supplies a gas to the porous portion of the mold 2, as illustrated in FIG. 1A. The supply portion 16 can include, for example, a gas supply path, a gas supply source, and a valve which controls gas supply and stop.

Some embodiments of the mold 2 having a porous portion such as a porous layer will be described with reference to FIGS. 4A to 4D. In an example shown in FIG. 4A, the mold 2 has a porous portion 8 arranged around the pattern portion 5, and a gas 20 is supplied from the supply portion 16 (see FIG. 1A) provided on the imprint head 3 to the porous portion 8. The porous portion 8 can be arranged to surround the pattern portion 5 throughout the entire circumference. In an example shown in FIG. 4B, the porous portion 8 is partially covered with a non-porous member 9 in order to limit the region in which the gas is exhausted from the mold 2. The non-porous member 9 is a member which does not allow passage of the gas or that which passes the gas by an amount smaller than the porous portion 8. In the arrangements shown in FIGS. 4A and 4B, the time period in which the gas is exhausted from the porous portion 8 may or may not include a time period in which the mold 2 is in contact with the resin. In the examples shown in FIGS. 4A and 4B, the controller CNT controls the supply portion 16 to supply a gas to the space, which the pattern surface PS faces, before the resin and the pattern surface PS of the mold 2 are brought into contact with each other.

Figure 4A:
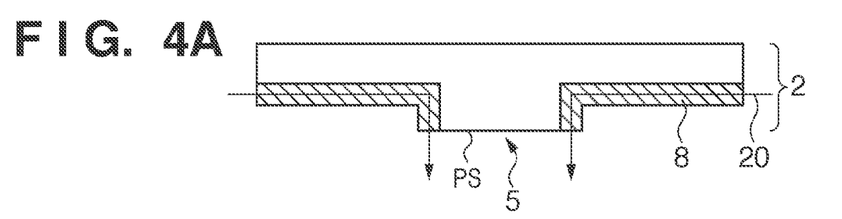
FIGS. 4A to 4F are views schematically showing the structure of a mold according to the first embodiment of the present invention.
Figure 4B:
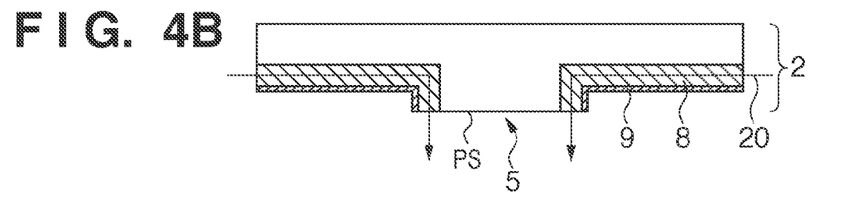
Figure 4C:
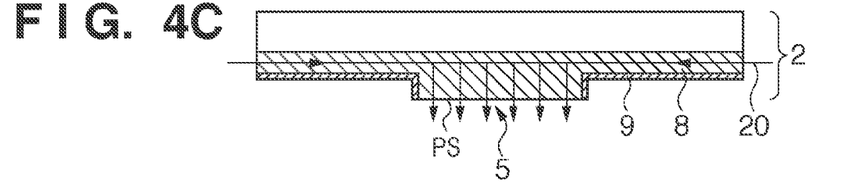
Figures 4D, 4E:
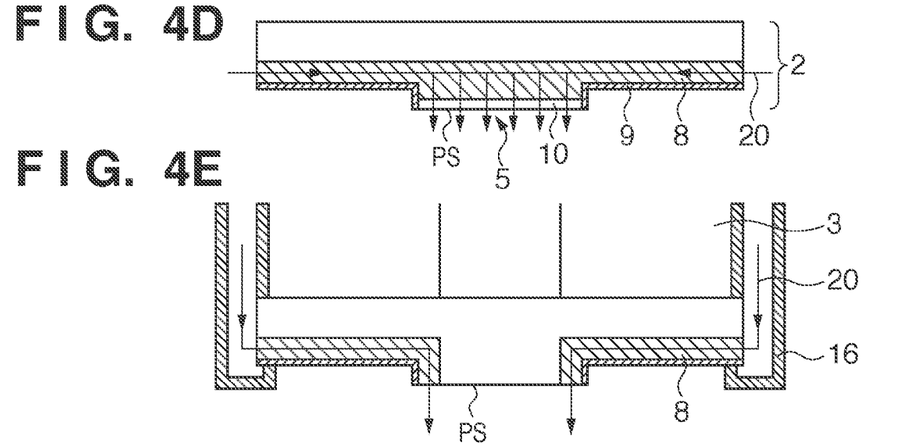

In an example shown in FIG. 4C, the pattern portion 5 is formed from the porous portion 8, so the gas is also exhausted from the pattern portion 5. The arrangement in the example shown in FIG. 4C has not only a function of supplying a gas to the space (this space can also be expressed as the space on the outer or lower side of the pattern portion 5) which the pattern portion 5 faces, but also a function of removing any foreign substances adhering on the pattern portion 5. In the arrangement shown in FIG. 4C, the pattern portion 5 has a relatively low strength, so the porous portion 8 may be partially covered with a capping layer 10 formed from a non-porous member to form the pattern portion 5 in the capping layer 10, as shown in FIG. 4D. Gases such as hydrogen and helium with low molecular weights are known to generally pass through, for example, rubber and glass. Hence, providing, for example, an $SiO_x$ layer (for example, an $SiO_2$ layer) with a thickness of about several tens of nanometers as the capping layer 10 makes it possible not only to pass the gas but also to increase the pattern strength. In the examples shown in FIGS. 4C and 4D, the controller CNT controls the supply portion 16 to exhaust the gas from the porous portion 8 during at least part of the time period before the mold 2 is brought into contact with the resin, and not to exhaust the gas during the time period from when the mold 2 is pressed against the resin until the resin cures. Instead of forming the pattern portion 5 in the capping layer 10, the pattern portion 5 may be formed by forming a pattern in the porous portion 8 and covering this pattern with the capping layer 10. In this case, the capping layer 10 is formed to have a thickness sufficiently smaller than the width of the concave portions 6 of the pattern formed in the porous portion 8.

Figure 4F:
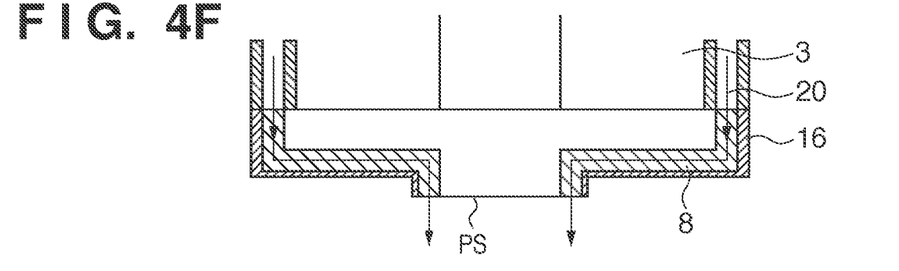

FIGS. 4E and 4F illustrate the supply portion 16 which supplies a gas to the porous portion 8 of the mold 2. According to this embodiment, a gas can be locally supplied to the space between the pattern portion 5 of the mold 2 and each shot region on the substrate 1 by providing the mold 2 with the porous portion 8 which receives the gas from the supply portion 16 provided in the imprint apparatus 100 and exhausts this gas. Such an arrangement obviates the need to provide a cover to surround the imprint head 3, and can therefore downsize the imprint apparatus 100. Also, such an arrangement can accelerate filling of the concave portions 6 with the resin when the pattern surface PS in the pattern portion 5 is brought into contact with the resin by exhausting a gas which is soluble in the resin from the porous portion 8 and supplying this gas to the space which the pattern surface PS in the pattern portion 5 faces. This makes it possible to improve the throughput of imprint processing. Also, by accelerating filling of the concave portions 6 with the resin, pattern transfer failures due to incomplete filling of the concave portions 6 with the resin can be reduced to improve the yield.

<Second Embodiment>

Figure 1B:
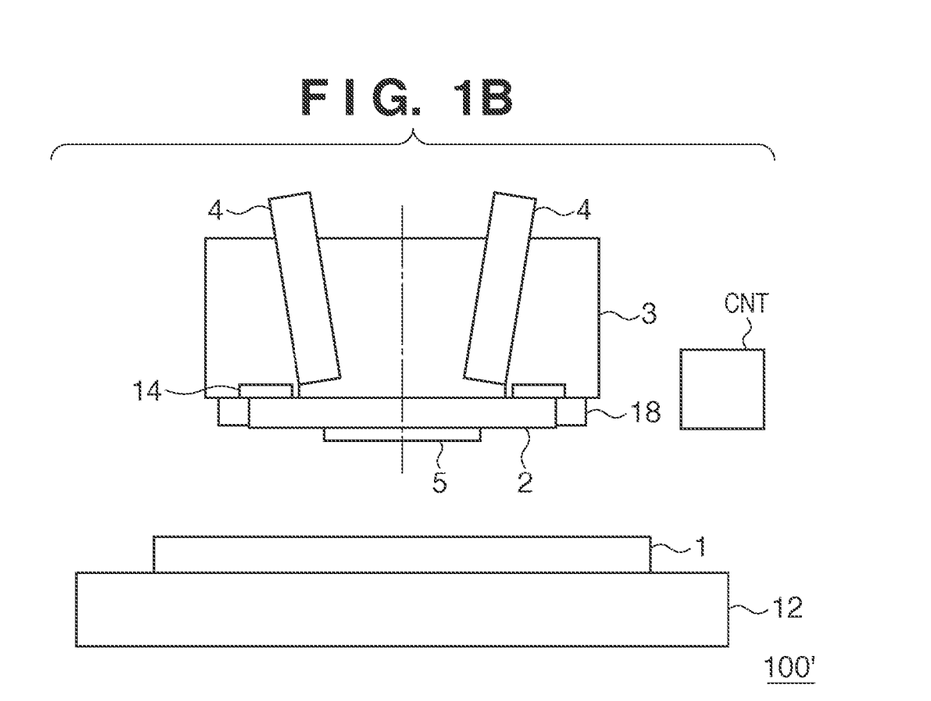
Figure 5A:
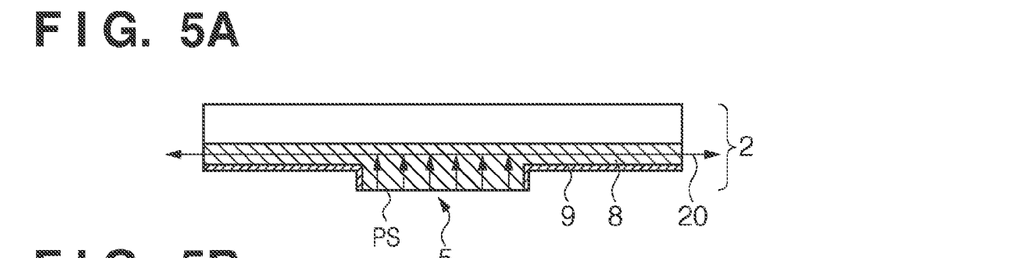
FIGS. 5A to 5D are views schematically showing the structure of a mold according to the second embodiment of the present invention.
Figure 5B:
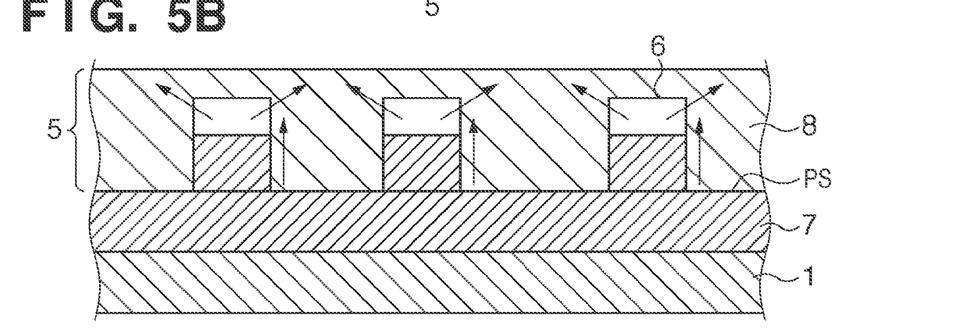

FIG. 1B shows the schematic arrangement of an imprint apparatus 100' according to the second embodiment of the present invention. The same reference numerals as in the constituent elements of the imprint apparatus 100 according to the first embodiment denote the same constituent elements in FIG. 1B. The imprint apparatus 100' according to the second embodiment has an arrangement in which the supply portion 16 in the imprint apparatus 100 according to the first embodiment is replaced with a gas controller 18. Although a mold 2 can have an arrangement similar to that in the first embodiment, it is preferably covered with a non-porous member 9 in a portion other than a pattern portion 5. FIG. 5A shows one example of the mold 2 which can be used in the second embodiment. The gas controller 18 includes a suction portion which draws the gas in concave portions 6 of the pattern by suction via a porous portion 8 that forms the pattern portion 5 of the mold 2, while the pattern portion 5 of the mold 2 is pressed against a resin 7. Thus, the concave portions 6 are deeply rapidly filled with the resin 7, as schematically shown in FIG. 5B. The gas controller 18 may also include a supply portion which supplies a gas to the porous portion 8 so as to exhaust the gas from the porous portion 8.

The porous portion 8 can be formed as a layer having a large number of pores with a size large enough to pass the gas (for example, air, $H_2$, or $He_2$) present in the space to undergo processing of bringing the pattern surface of the mold 2 into contact with the resin. When a gas (for example, $H_2$ or $He_2$) with a low molecular weight is to be supplied to the space between the mold 2 and a substrate 1 before the pattern surface of the mold 2 is brought into contact with the resin, the pores in the porous portion 8 have a size large enough to pass the gas. When $H_2$ or $He_2$ is used as a gas to be supplied to the space to undergo processing of bringing the pattern surface of the mold 2 into contact with the resin, the porous portion 8 can be formed as, for example, a layer with a size of about several nanometers. The gas inside the concave portions 6 of the pattern formed in the pattern portion 5 passes through the porous portion 8 and is drawn by suction by the gas controller 18, whereas the resin 7 cannot pass through the porous portion 8 and remains in the concave portions 6. The concave portions 6 are rapidly filled with the resin 7 by drawing the gas inside the concave portions 6 by suction.

Figure 5C:
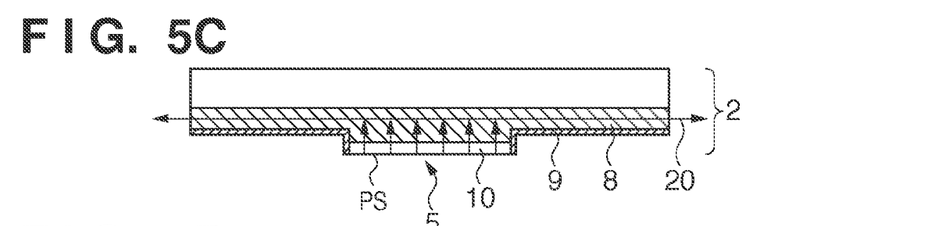
Figure 5D:
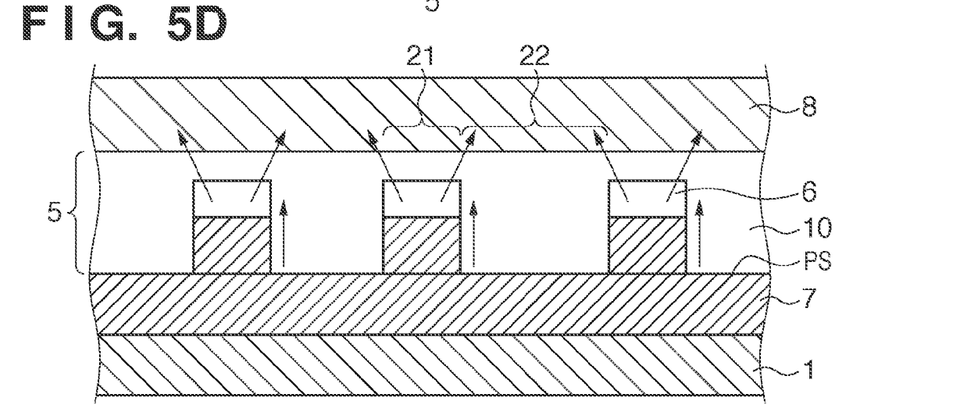

The porous member has a strength lower than, for example, $SiO_2$ having no porous structure. Hence, a thin capping layer (non-porous member) 10 such as an $SiO_x$ layer (for example, an $SiO_2$ layer) may be stacked on the surface of the porous portion 8, and the pattern portion 5 may be formed on the capping layer 10, as illustrated in FIGS. 5C and 5D. When an SiO layer is adopted as the capping layer 10, the gas can pass through the $SiO_x$ layer upon forming the $SiO_x$ layer as thin as about several tens of nanometers. In this case, both the capping layer 10 and the porous portion 8 function as members which pass the gas. In the example shown in FIG. 5D, in the pattern portion 5, the capping layer 10 can have first portions 21 corresponding to the concave portions 6, and second portions 22 corresponding to portions (convex portions) other than the concave portions 6. The first portion 21 is thinner than the second portion 22, so the gas is more likely to pass through the first portion 21 than through the second portion 22. Therefore, the gas can be more readily drawn by suction through the first portion 21 from the bottom of the concave portions 6 than through the second portion 22. As a result, the gas inside the concave portions 6 is drawn by suction effectively. Instead of forming the pattern portion 5 in the capping layer 10, the pattern portion 5 may be formed by forming a pattern in the porous portion 8 and covering this pattern with the capping layer 10. In this case, the capping layer 10 is formed to have a thickness sufficiently smaller than the width of the concave portions 6 of the pattern formed in the porous portion 8.

After the concave portions 6 are filled with the resin 7, the resin 7 can be cured by, for example, irradiating the resin 7 with light such as ultraviolet light. After that, the mold 2 is separated from the cured resin 7 or the substrate 1. At this time, a force acts to pull the cured resin 7 out of the concave portions 6, so the cured resin 7 may suffer damage or peel off the substrate 1. To prevent this, a gas is preferably supplied from the gas controller 18 to the porous portion 8 to feed it into the concave portions 6, thereby assisting the separation of the mold 2 from the resin 7. This makes it possible to separate the resin 7 and the pattern portion 5 of the mold 2 from each other with a weaker force, thus decreasing the possibility that a defect occurs in the pattern of the resin upon separation. Note that a gas which can pass through the porous portion 8, like that described above, is used as a gas to be supplied to the porous portion 8.

Figure 6:
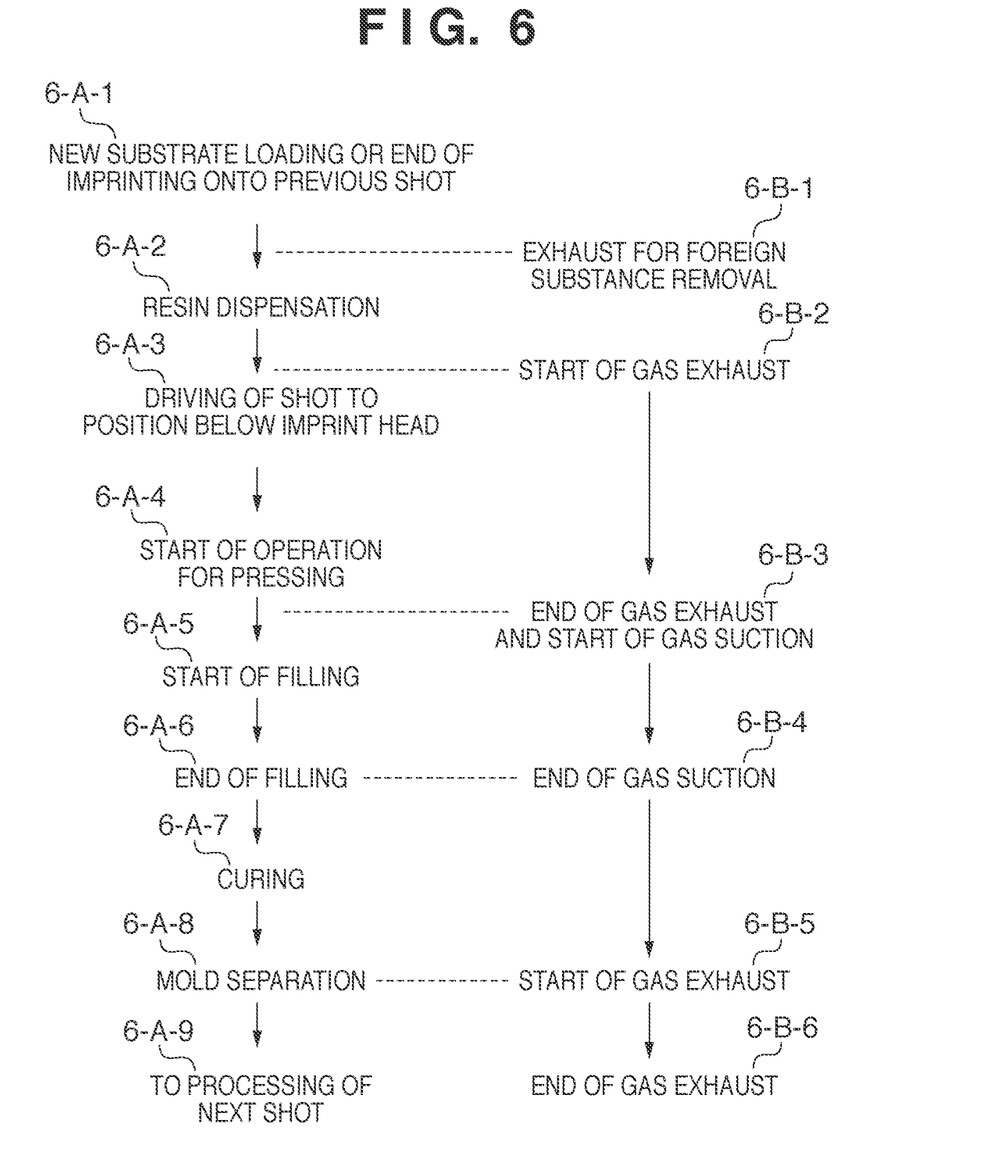
FIG. 6 is a sequence chart showing the operation of an imprint apparatus according to the second embodiment of the present invention.

An imprint operation in the imprint apparatus 100' will be exemplified with reference to FIG. 6. A controller CNT controls the following sequence. The left side in FIG. 6 shows the sequence of the imprint operation, and the right side in FIG. 6 shows the operation of the gas controller 18. After new substrate loading or imprinting (pattern transfer including resin dispensation, mold pressing, and resin curing) onto the previous shot region ends (6-A-1), a resin is dispensed onto a shot region onto which a pattern is to be transferred next (6-A-2). Note that a commonly used resin has so high a volatility that it vaporizes before the mold 2 is pressed, when it is dispensed onto the entire surface of the substrate. To prevent this, it is a common practice to dispense a resin only onto a shot region, on which a pattern is to be transferred next, immediately before transfer. If the resin has a sufficiently low volatility, mold pressing against each shot region and resin curing can be performed after the resin is dispensed onto the entire surface of the substrate.

During an arbitrary time period from the end of substrate loading or imprinting onto the previous shot region until the substrate 1 is driven so that the next shot region is positioned below an imprint head 3, that is, before the resin and a pattern surface PS of the mold 2 are brought into contact with each other, a gas can be supplied to the porous portion 8 of the mold 2 by the gas controller 18. Thus, the gas can be exhausted from the porous portion 8 of the mold 2, and any foreign substances adhering on a pattern portion 5 can be removed. Note that if the gas is exhausted from the porous portion 8 while the substrate 1 is present below the imprint head 3, foreign substances may fall onto the substrate 1. To prevent this, the gas controller 18 may be operated to exhaust the gas from the porous portion 8 during, for example, the time period in which the substrate 1 is unloaded from the position below the imprint head 3 for resin dispensation or that in which the substrate 1 is loaded (or replaced).

The substrate 1 on which the resin is dispensed is driven by a positioning mechanism 12 so that a shot region onto which a pattern is to be transferred is placed below the imprint head 3 (6-A-3). At this time, a gas is supplied to the porous portion 8 by the gas controller 18. Thus, the gas is exhausted from the porous portion 8 and supplied to the space between the imprint head 3 and the substrate 1 (6-B-2). After that, an operation of lowering the imprint head 3 or that of lifting the substrate 1, that is, an operation of bringing the pattern surface PS of the mold 2 into contact with the resin starts (6-A-4). The moment the pattern surface PS of the mold 2 and the resin dispensed on the substrate 1 come into contact with each other, filling of the concave portions of the pattern portion 5 with the resin starts (6-A-5). Gas supply to the porous portion 8 (that is, gas exhaust from the porous portion 8) by the gas controller 18 stops before the start of filling, and gas suction via the porous portion 8 by the gas controller 18 starts at the start of filling (6-B-3). The concave portions of the pattern portion 5 are filled with the resin in a short period of time by gas suction. After the end of the filling, the gas suction via the porous portion 8 by the gas controller 18 ends (6-B-4). After the end of the filling (6-A-6), the resin is cured by a method of, for example, irradiating it with light (6-A-7). The mold 2 is separated from the substrate 1 (6-A-8). At this time, gas supply to the porous portion 8 (that is, gas exhaust from the mold) is performed by the gas controller 18, so the separation of the mold 2 from the substrate 1 is accelerated (6-B-5). After the end of the separation of the mold 2 from the substrate 1, the gas supply to the porous portion 8 (that is, the gas exhaust from the mold) by the gas controller 18 ends (6-B-6). Note that when an interferometer, for example, is used as a measuring device, an error may occur in the measured value due to the difference between the refractive index of air and that of the gas supplied from the gas controller 18, so minimum necessary gas exhaust must be performed. After the imprint processing onto the current shot region ends in the foregoing way, imprint processing onto the next shot region is executed (6-A-9).

As described above, by drawing the gas from the concave portions 6 of the pattern portion 5 of the mold 2 by suction via the porous portion 8, filling of the concave portions 6 with the resin can be accelerated. Also, by supplying a gas to the concave portions 6 to separate the mold 2 from the cured resin, the separation can be facilitated, thus reducing defects which may occur in the pattern of the cured resin. Moreover, by supplying a gas to the porous portion 8 of the mold 2 and exhausting the gas from the pattern portion 5, any foreign substances can be removed from the pattern portion 5. This makes it possible to improve the throughput of imprint processing and/or to reduce pattern transfer failures due to incomplete filling of the concave portions 6 with the resin to improve the yield.

[Method of Manufacturing Article]

A method of manufacturing an article includes a step of transferring (forming) a pattern onto a substrate (for example, a wafer, a glass plate, or a film-like substrate) using the above-mentioned imprint apparatus, and a step of processing (for example, etching) the substrate onto which the pattern is transferred. The article to be manufactured can include devices such as a semiconductor integrated circuit device and a liquid crystal display device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-068916, filed Mar. 24, 2010, which is hereby incorporated by reference herein in its entirety.

What is claimed is:

1. An imprint apparatus which cures a resin dispensed on a substrate while the resin and a mold are in contact with each other, the mold including a porous portion having a portion forming a side surface of the mold, and the imprint apparatus comprising:

a chuck configured to hold the mold; and a suction portion configured to communicate only with the porous portion on the side surface of the mold and to draw a gas only from the side surface of the mold by suction, so that the gas is drawn via the porous portion from a concave portion of a pattern formed in a pattern portion of the mold which is in contact with the resin, to accelerate filling of the concave portion with the resin.

2. The apparatus according to claim 1, further comprising a supply portion configured to supply a gas to the porous portion of the mold so that the gas is exhausted from the porous potion to accelerate separating the mold from the cured resin.

* * * * *